United States Patent [19]

Sexton, Jr.

[11] Patent Number: 4,962,363
[45] Date of Patent: Oct. 9, 1990

[54] SURFACE MOUNTABLE LEADLESS FUSE
[75] Inventor: William F. Sexton, Jr., Porter, Ind.
[73] Assignee: Littelfuse, Inc., Des Plaines, Ill.
[21] Appl. No.: 335,682
[22] Filed: Apr. 10, 1989
[51] Int. Cl.$^5$ ............................................. H01H 85/02
[52] U.S. Cl. .................................. 337/186; 337/213; 337/228; 361/403
[58] Field of Search ....................... 337/186, 213, 228; 361/403

[56] References Cited

U.S. PATENT DOCUMENTS

| 316,077 | 4/1885 | Stevens . | |
|---|---|---|---|
| 1,021,549 | 3/1912 | Murray . | |
| 3,194,926 | 7/1965 | Ustin . | |
| 3,684,817 | 8/1972 | Card, Jr. et al. | 174/52 |
| 3,813,637 | 5/1974 | Grebik et al. | 339/59 |
| 4,755,785 | 7/1988 | Bernstein | 337/186 |

FOREIGN PATENT DOCUMENTS

| 115541 | 8/1976 | Japan . |
|---|---|---|
| 554578 | 7/1943 | United Kingdom . |

Primary Examiner—H. Broome
Attorney, Agent, or Firm—Wallenstein Wagner & Hattis

[57] ABSTRACT

A surface mountable leadless fuse generally includes a tubular fuse sub-assembly with an insulating body molded thereto in intimate sealing relation. The tubular fuse sub-assembly includes a nonconductive tubular housing, cup-shaped metal end caps enclosing the housing. The insulating body includes an upper and lower portion which are integral as molded. The end caps protrude from a bottom surface of the insulating body so that the fuse can engage the flat conductive areas of a circuit board for soldering thereto without obstructiion of the insulting body. The end caps also protrude from the end surfaces so that visual inspection and solder wetting are unobstructed. The lower portion of the insulating body covers an exposed portion of the tubular housing. A pair of anti-rolling legs depend from opposed margins of the bottom surface to prevent the fuse from rolling off of the circuit board once placed there.

10 Claims, 2 Drawing Sheets

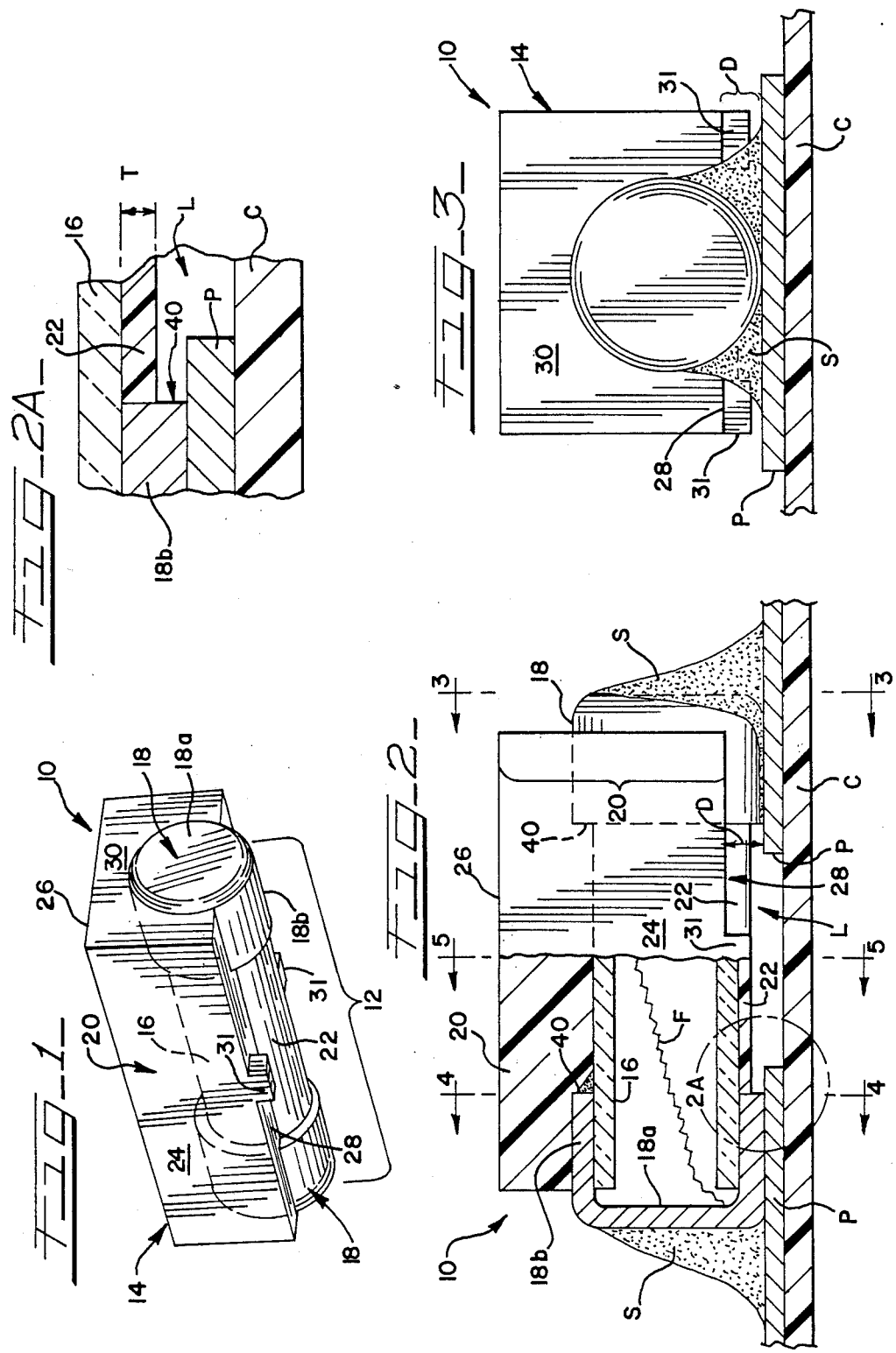

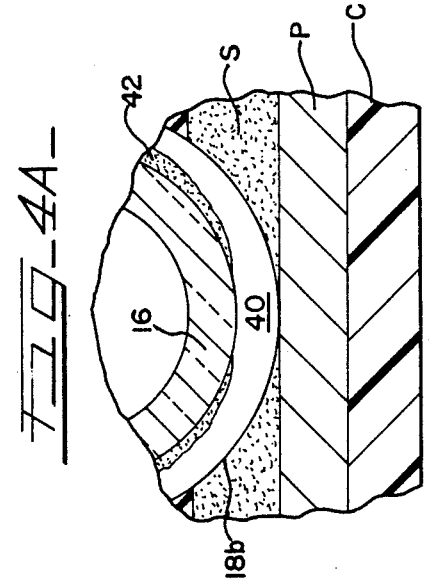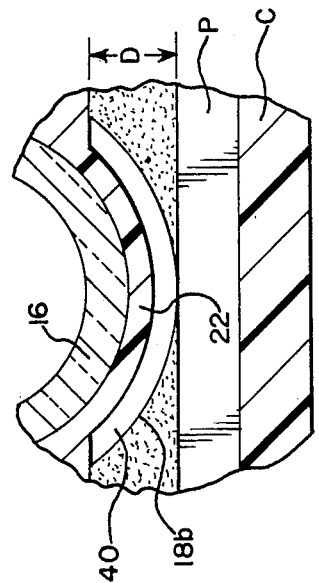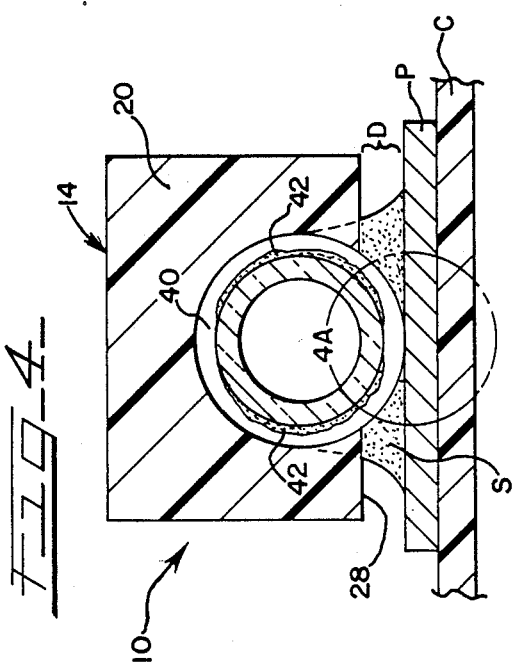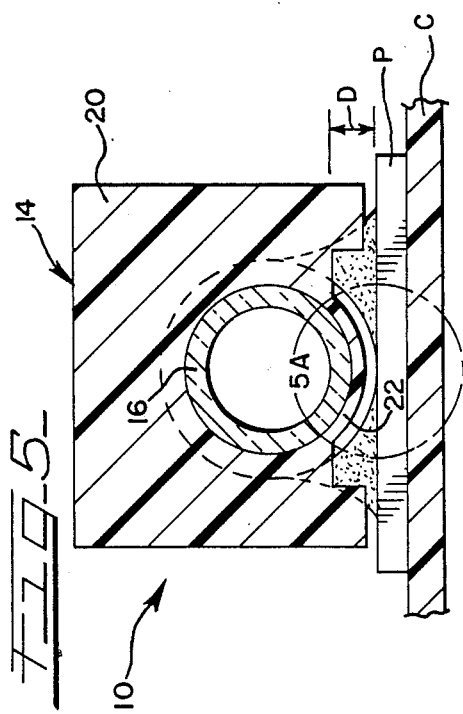

SURFACE MOUNTABLE LEADLESS FUSE

DESCRIPTION

1. Technical Field

The present invention generally relates to surface mountable leadless fuse assemblies.

2. Background of the Invention

Historically, cartridge fuses having a cylindrical shape have been a preferred fusible element in a wide variety of circuit environments. As such, over the years, a great deal of technology has been developed in the automated manufacture and perfection of such cylindrical cartridge fuses.

Conventional cartridge fuses have cylindrically shaped tubular insulating housings which are closed off by cup-shaped metal end caps. A fuse filament is disposed within the housing and connected between the end caps. Commonly leads extend from the caps for electrical connection of the fuse to a circuit. In recent years, there has become a great need to incorporate cartridge fuses as circuit elements on printed circuit boards, in which case attaching the fuse via external leads normally requires drilling attachment holes for the leads and soldering both sides of the circuit board.

It is, therefore desirable to mount a cylindrical cartridge fuse to flat conductive areas of a circuit board without the use of external leads. Conventionally this is done by soldering the metal end caps directly to a pair of such conductive areas. However, in practice, the handling of cylindrical objects, in automated equipment dedicated to this purpose, has proved to be extremely difficult. In particular, it is preferable that the emplacement equipment release a component before melting of the solder begins. However, since a cylindrical fuse has an inherent propensity for rolling across a printed circuit board, it proves necessary to hold the fuse captive during the solder melting operation. Furthermore, effective grasping by standard emplacement equipment, called "pick and place" equipment, requires a circuit element to have flat sides.

Additional problems exist in the use of tubular fuses in modern printed circuits. For example, it is preferable to package circuit components in high density. During short circuiting or short circuit testing of a mounted fuse, the end caps may be explosively projected thus presenting a hazard to persons and surrounding circuit components.

Also, conventional tubular fuses are not sealed against ingress of process chemicals such as flux or printed circuit cleaning chemicals. These chemicals may infiltrate the tiny interstices between the end caps and the tubular fuse housings. If the chemicals enter the fuse, they can become corrosive to the end caps, the filament and the connections therebetween.

Recently attempts have been made to adapt a standard cylindrical cartridge fuse for leadless surface mountable attachment to a circuit board by pick and place equipment. For example, U.S. Pat. No. 4,755,785 to Bernstein, discloses a fuse generally comprising a conventional tubular fuse with an attached rectangular fuse cover. The fuse cover of the Bernstein fuse has vertical flat sides cooperable with pick and place equipment and has ears depending from the cover to engage a circuit board to prevent rolling of the fuse. Bernstein also discloses that the cover and ears provide reinforcement to better enable the device to withstand short circuit testing. The fuse of Bernstein, however, has a number of deficiencies and additionally fails to adequately solve problems presented in the art.

Notably, the fuse of Bernstein provides for reinforcement of the tubular fuse in part by "backing" an upper portion of the end caps of the tubular fuse. Covering this portion of the end caps obstructs access and visibility of the end cap. This inhibits inspection and testing of the mounted fuse and the solder connection. An unobstructed view of the end cap is especially important in circuits having high component density, requiring small components. For example, such a fuse may be on the order of no more than about 0.2 inches long.

In addition, the "backing" obstructs the adequate wetting of the entire end surface of the end cap and the formation of a substantial solder fillet to mechanically connect the fuse to the circuit board.

The fuse of Bernstein does not provide for protection of ingress of chemicals into the interstices between the end caps and tubular housing. These interstices can trap undesired process chemicals which may not be removed in the normal cleaning process. The retention of certain process chemicals can cause progressional corrosion of the end caps. If the chemicals reach the interior of the fuse housing, connections and other circuit elements in the housing can be damaged.

SUMMARY OF THE INVENTION

The invention generally includes a tubular fuse sub-assembly with a body of insulating material molded to the sub-assembly in a selected configuration which permits automated surface mounting of the fuse to a circuit board.

The tubular fuse sub-assembly includes a fusible element disposed within a tubular housing and electrically connected between cup-shaped metal end caps. Each end cap is formed by an end wall and an axially extending skirt. The tubular housing fits within the end cap skirts and the end caps enclose opposed ends of the housing.

According to a broad aspect of the invention, an insulating body is molded to the sub-assembly in intimate sealing relation thereto. Preferably the insulating body, as molded, has generally rectangular external surfaces including a top surface, a bottom surface, opposed end surfaces and opposed side surfaces. The opposed side surfaces are adapted to be easily engaged by standard "pick and place" emplacement equipment.

At least a portion of an end cap skirt of each end cap protrudes from the bottom surface of the insulating body. In this position, the protruding portions of each end cap skirt is exposed below the plane of the insulating body so that each end cap skirt can engage a flat conductive surface of a printed circuit board for soldering thereto without obstruction of the insulating body.

In a broad aspect of the invention the insulating body need only extend longitudinally to cover a medial portion of the tubular housing so as to provide at least sufficient surface area of the opposed side surfaces so that they can be gripped by the pick and place equipment. Advantageously, in this configuration, at least a flat end surface of each end cap is exposed. This permits solder to wet the entire end surface of the end cap and permits the solder to form a substantial and unobstructed solder fillet on the exposed end surface of the end caps. This also permits unobstructed visibility of the end surfaces of the end caps and the solder fillets for inspection of the solder connection.

According to another aspect of the invention, however, the insulating body extends longitudinally to cover a marginal portion of the top and side surfaces of both end cap skirts, while still terminating short of the flat end surface of each cap. Because the insulating body is molded to both the tubular body and the margin of the end cap skirts, the insulating body aids in holding the end caps on the tubular housing. Thus, the insulating body provides strength against the end caps blowing off during short circuit and generally provides improved reinforcement of the fuse sub-assembly as a whole. Furthermore, the insulating body seals the fuse sub-assembly against the ingress of process chemicals into any access openings between the tubular housing and end caps.

It will be appreciated that the thickness of an end cap skirt is relatively thin, especially in fuses used in high component density circuits which may be no more than 0.2 inches long. The end cap of such a fuse can have a skirt thickness of 0.010 inches. According to one aspect of the invention, a portion of the insulating body must be very thin if it is to cover the bottom of the tubular housing to seal any interstices at the bottom of the housing without projecting below the level of the exposed portion of the end cap skirts. As noted above, a portion of the end cap skirts must be unobstructed to seat on the conductive pads on a printed circuit board. It was heretofore probably not considered to mold an insulating material on such small fuses where a portion of the material was required to have a thickness less than the thickness of the end cap skirt in all cases. In the preferred form of the invention, such a thin portion of insulating material is molded onto the bottom surface of the tubular housing.

The insulating body preferably has an upper portion from which the insulating body coated portions of the bottom portion of the tubular housing projects. Anti-rolling legs are preferably provided which depend from opposed margins of the bottom surface of this upper portion of the insulating body to prevent the fuse from rolling off of the circuit board after emplacement but before soldering.

A marked advantage of the fuse of the present invention is that the insulating body is formed and attached to the sub-assembly in one manufacturing step. In contrast, the type of fuse disclosed in Bernstein provides for a cover which presumably is made separately then attached to a cartridge fuse sub-assembly in an additional manufacturing step.

Other advantages and aspects of the invention will become apparent upon making reference to the specification, claims, and drawings to follow.

BRIEF DESCRIPTION OF THE DRAWINGS

FIG. 1 is a bottom perspective view of the surface mountable leadless fuse of the present invention;

FIG. 2 is a side elevational view of the fuse of the invention as mounted to a circuit board, with a partial cross section taken along line 2—2 of FIG. 1;

FIG. 2A is a magnified view of a portion of the fuse within the circle 2A of FIG. 2;

FIG. 3 is a cross sectional view of the mounted fuse of the invention, taken along line 3—3 of FIG. 2;

FIG. 4 is a cross sectional view of the mounted fuse of the invention, taken along line 4—4 of FIG. 2;

FIG. 4A is a magnified view of a portion of the fuse within the circle 4A of FIG. 4;

FIG. 5 is a cross sectional view of the mounted fuse of the invention, taken along line 5—5 of FIG. 2; and, FIG. 5A is a magnified view of a portion of the fuse within the circle 5A of FIG. 5.

DETAILED DESCRIPTION OF THE INVENTION

While this invention is susceptible of embodiment in many different forms, there is shown in the drawings and will herein be described in detail a preferred embodiment of the invention. The present disclosure is to be considered as an exemplification of the principles of the invention and is not intended to limit the broad aspects of the invention to embodiment illustrated.

The embodiment herein disclosed is unobviously well suited to the manufacture of very small fuses used in high component density circuits. It is also well suited to most any size fuse where leadless surface mounting is desired.

Referring now to the drawings, FIG. 1 discloses a preferred embodiment of a surface mountable leadless fuse of the present invention, generally indicated by reference number 10. The surface mountable fuse 10 generally includes a tubular fuse sub-assembly 12, a body of insulating material 14 (hereinafter referred to as insulating body 14). The insulating body 14 is molded to fuse sub-assembly 12 in intimate sealing relation therewith. It will be appreciated that, as a result of molding, any portions of the fuse sub-assembly which are covered by the insulating material are thereafter adhered to the insulating body 14.

Tubular fuse sub-assembly 12 generally includes a nonconductive tubular housing 16 enclosed by metal end caps 18. Each end cap 18 includes an end wall 18a and a skirt 18b. In a horizontally oriented position as illustrated, the insulating body 14 generally includes a relatively thick upper portion 20 and thin lower portion 22. The upper portion 20 covers all but the bottommost portions of the tubular housing 16 and the end cap skirts 18b. The thin lower portion 22 covers a bottommost portion of the tubular housing 16 which projects from the upper portion 20 of the insulating body 14 as will be discussed below. The upper portion 20 is, preferably, generally rectangular as molded and includes opposed vertical side surfaces 24, a top surface 26, a bottom surface 28 and opposed end surfaces 30. A pair of anti-rolling legs 31 depend from the bottom surface 28 for a purpose described below.

It should be noted that, according to a broad aspect of the invention, a portion of only the end cap skirts 18b need protrude from bottom surface 28, so that the end caps 18 can engage a flat conductive surface for soldering thereto. However, in a preferred embodiment as herein disclosed and shown in the drawings, an entire length portion of the tubular fuse sub-assembly 12 protrudes from the bottom surface 28 including a portion of the tubular housing 16. In this preferred configuration, the protruding portion of the tubular housing 16 is covered by the very thin lower portion 22 of the insulating body 14.

The side surfaces 24 of upper portion 20 provide flat surfaces which are to be engaged by the jaws of standard pick and place equipment so that the fuse 10 can be surface mounted by such automated equipment.

FIG. 2 discloses the fuse 10 anchored and electrically coupled by solder fillets S to a pair of conductive pads P of a circuit board C. A space L is left under the tubular housing between the end caps 18.

As disclosed more specifically in FIG. 2, the fuse sub-assembly 12 includes, tubular housing 16, end caps 18 and a fusible means, such as fuse element F. Fuse element F is disposed in the tubular housing 16 and is electrically connected between the end caps 18 in a conventional manner. End caps skirts 18b are dimensioned to receive an end portion of tubular housing 16 therein. Each end cap skirt 18b terminates in a terminal end edge 40. Each end edge 40 is in the form of a ring and is generally perpendicular to an outer surface of the tubular housing 16. Tubular housing 16 is made of a nonconductive material such as glass or ceramic, and each end cap 18 is made of metal, as is conventional.

As best disclosed in FIGS. 1 and 2, the upper portion 20 of the insulating body 14 preferably extends longitudinally to cover the top and side surfaces of most of both skirts 18b of end caps 18, but terminates short of the end cap wall 18a so that the lower extremities of the end cap skirts 18b and the outer surfaces of the end cap wall 18a are completely exposed. The bottommost portion of the entire length of the end cap skirts 18b protrude from the insulating body 14. The upper portion 20 encapsulates the top and side surfaces of the tubular housing 16 and the end cap skirts 18b. The thin lower portion 22 of the insulating body covers the portion of the tubular housing 16 which protrudes from the upper portion 20. Thus, together, upper portion 20 and lower portion 22 provide a seal between the tubular housing 16 and end caps 18 to prevent the ingress of chemicals from the cleaning or soldering process is discussed further below.

In practicing the preferred form of the invention, a clearance distance (designated by D of FIGS. 2, 3, and 5) between the bottom surface 28 of the upper portion 20 of the insulating body and the conductive areas P of the circuit board C is provided. This clearance can be varied by varying the amount the sub-assembly protrudes from the bottom surface 28 of the upper portion 20 of the insulating body. As distance D increases, more surface area of the end cap skirts 18b are exposed. This allows a more substantial solder fillet to underlie the end cap skirts 18b. Furthermore, increasing distance D leaves exposed and accessible, areas of the printed circuit board for cleaning chemicals such as space L. In the preferred embodiment disclosed herein, this clearance distance D requires that a portion of the insulating body coated tubular housing 16 protrude from the bottom surface 28 of the upper portion 20.

More specifically, FIGS. 1 and 2 disclose that the thin lower portion 22 of the insulating body extends longitudinally only between the end edges 40 of the end caps 18. Lower portion 22 is of even thickness and generally follows a contour presented by the protruding portion of tubular housing 16. As best disclosed in FIGS. 2A and 5A, the lower portion 22 extends radially from tubular housing 16 to a point short of an outer surface of the end cap skirts 18, thus defining a thickness T (FIG. 2A) of lower portion 22. In this position, the lower portion 22 does not obstruct the end cap skirts 8b from engaging the conductive pads during mounting. Preferably, the thickness T is approximately equal to ½the radial distance of the end cap skirts 18b.

As disclosed in FIG. 2A, the lower portion 22 of the insulating body 14 is adhered to the edges 40 of end cap skirts 18b. Thus, together, the upper portion 20 and the lower portion 22 of the insulating body provide a complete seal for the tubular fuse sub-assembly. Thereby, the ingress of process chemicals are prevented from entering any spaces between the end cap skirts 18b and the tubular housing 16.

Additionally, as a result of insulating body 14 being molded to both the tubular housing 16 and to the end caps 18, the end caps 18 are adhered to the tubular body 16 and to the insulating body 14. This provides for added securement of the end caps to the tubular body and general reinforcement of the entire fuse sub-assembly. At the same time, the insulating body 14 leaves the entire exposed outer surfaces of the end cap walls 18a and a portion of the end cap skirts 18b are exposed for wetting by solder fillets S (FIGS. 2 and 3). Thus, a more solid mechanical and electrical connection of fuse 10 is achieved than if the solder fillets S were obstructed from wetting the entire outer surfaces. Similarly, the solder fillets are not obstructed from visual inspection during manufacture or repair.

Anti-rolling legs 31 depend from bottom surface 28 of upper portion 20 of the insulating body at opposed medial margins thereof. Anti-rolling legs 31 prevent substantial rolling of fuse 10 when placed on circuit board C and thus prevent the end caps from rolling off of the conductive areas P of the circuit board C before soldering. Thus, only a small amount of rocking can occur during mounting of the fuse 10. Legs 31 terminate short enough so that they do not engage board C when both legs 31 are equidistant from the board. This provides enhanced anti-rolling characteristics for the fuse 10 with minimal obstruction into the space L.

In a preferred embodiment, insulating body 14 is made from DAP phenolic resin. It will be noted that, according to the present invention, any resin suitable for process molding and possessing generally nonconductive properties may be used to make insulating body 14.

FIGS. 4 and 4A disclose an adhesive band 42 which is applied initially as beads of such material to the juncture between the end cap skirt end edges 40 and the tubular housing 16. The beads of adhesive keep the end caps 18 on the tubular housing 16 during handling prior to the molding of insulating body thereover. When the molding operation is carried out, the beads run along the juncture line of the end cap skirt end edges 40 and the tubular housing to form the adhesive bands 42.

This molding operation was carried out by commercial molding equipment never before believed useful for molding such thin sections as the thin lower portion of the insulating body 14. This equipment is disclosed in U.S. Pat. No. 4,601,323.

In preferred embodiments of the fuse 10, desired indicia, such as amperage rating, may be formed on the outer surfaces of insulating body 14 by forming the same in the processing mold. In that form the indicia is highly resistant to eradication.

While the invention has been described with reference to a preferred embodiment, it will be understood by those skilled in the art that various changes may be made and equivalents may be substituted for elements thereof without departing from the broader aspects of the invention.

For example, the invention can be practiced on other than cylindrically tubular housings 16, such as polysided tubular housings. Also, it is intended that broad claims not specifying details of a particular embodiment disclosed herein as the best mode contemplated for carrying out the invention should not be limited to such details.

I claim:

1. A surface mountable leadless fuse comprising:
   a fuse sub-assembly including a nonconductive tubular housing with opposite initially open ends, a pair of conductive end caps closing said tubular housing ends and a fusible element within said housing electrically connected between said end caps;
   each end cap including an end wall and an end cap skirt extending from said end wall, said end cap skirt being dimensioned to receive an end portion of said tubular housing therein;
   a body of insulating material molded around said fuse sub-assembly in sealing relation therewith, said body, when said fuse sub-assembly is horizontally oriented for mounting on a horizontal support surface of a circuit board, including a top surface, a bottom surface, opposed end surfaces and opposed sides; and
   at least a portion of each said end cap skirt protruding form said bottom surface of said body of insulating material, so that said at least a portion of each end cap skirt can engage a flat conductive surface on said horizontal support surface of said circuit board for soldering thereto without obstruction from said body.

2. The surface mountable leadless fuse of claim 1, having at least an outer surface of said end wall of each said end cap protruding from said opposed end surfaces of said body of insulating material so that the surface is exposed for solder wetting and inspection.

3. A surface mountable leadless fuse comprising:
   a fuse sub-assembly including a nonconductive tubular housing with opposite initially open ends, a pair of conductive end caps closing said tubular housing ends and a fusible element within said housing electrically connected between said end caps;
   each end cap including an end wall and an end cap skirt extending from said end wall, said end cap skirt being dimensioned to receive an end portion of said tubular housing therein;
   a body of insulating material molded around said fuse sub-assembly in sealing relation therewith, said body including a top surface, a bottom surface, opposed end surfaces and opposed side surfaces; and,
   a bottom portion of said fuse sub-assembly protruding from said bottom surface of said upper portion along an entire length of said fuse sub-assembly, including a bottom portion of said tubular housing being exposed and with a bottom portion of each said end cap skirt exposed to engage a flat conductive surface of a circuit board for soldering thereto without obstruction from said body.

4. The surface mountable leadless fuse of claim 3, having at least an outer surface of said end wall of each said end cap protruding from said opposed end surfaces of said body of insulating material so that the outer surface is exposed for solder wetting and inspection.

5. The surface mountable leadless fuse of claim 3 wherein said insulating body defines an upper portion of insulating material and further including a lower portion of said insulating material;
   said lower portion covering said bottom portion of said tubular housing which protrudes from said bottom surface of said upper portion of insulating material.

6. The surface mountable leadless fuse of claim 5 wherein said lower portion of said body of insulating material has a thickness less than the thickness of the of said end cap skirts and abutting an end edge of each end cap skirt to seal any opening between said tubular housing and said end cap skirts.

7. The surface mountable leadless fuse of claim 5 wherein said upper portion of said body of insulating material encapsulates top and side portions of said housing and end caps and said upper portion terminating short of the outer surface of said end walls of said end caps whose outer surfaces are then fully exposed and said lower portion of said body covers only the bottom portion of said tubular housing as a thin coating which is at a level above a bottommost portion of said end caps and abuts edges of said end cap skirts to seal said fuse sub-assembly from ingress of process chemicals into any openings between said end caps and housing.

8. The surface mountable leadless fuse of claim 1, 2, 3, 4, 5, 6 or 7 including anti-rolling legs depending from opposed margins of said bottom surface of said body of insulating material.

9. A surface mountable leadless fuse comprising:
   a fuse sub-assembly including a nonconductive tubular housing with opposite initially open ends, a pair of conductive end caps closing said tubular housing ends and a fusible element within said housing electrically connected between said end caps;
   each end cap including an end wall;
   a body of insulating material molded around said fuse sub-assembly in sealing relation therewith, said body, when said fuse sub-assembly is horizontally oriented for mounting on a horizontal support surface of a circuit board, including a top surface, a bottom surface, opposed end surfaces and opposed sides; and
   at least a portion of each said end cap protruding from said bottom surface of said body of insulating material, so that said at least a portion of each end cap can engage a flat conductive surface on said horizontal support surface of said circuit board for soldering thereto without obstruction from said body.

10. The surface mountable leadless fuse of claim 9, having at least an outer surface of each end wall of each said end cap protruding from said opposed end surfaces of said body of insulating material, so that the outer surface is exposed for solder wetting and inspection.

* * * * *